(12) United States Patent
Tanimoto

(10) Patent No.: US 10,068,788 B2
(45) Date of Patent: Sep. 4, 2018

(54) COMMUNICATION DEVICE AND METHOD FOR CONTROLLING COMMUNICATION DEVICE

(71) Applicant: MURATA MACHINERY, LTD., Kyoto-shi, Kyoto (JP)

(72) Inventor: Yoshifumi Tanimoto, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 232 days.

(21) Appl. No.: 15/031,305

(22) PCT Filed: Sep. 16, 2014

(86) PCT No.: PCT/JP2014/004759
§ 371 (c)(1),
(2) Date: Apr. 22, 2016

(87) PCT Pub. No.: WO2015/064000
PCT Pub. Date: May 7, 2015

(65) Prior Publication Data
US 2016/0276192 A1 Sep. 22, 2016

(30) Foreign Application Priority Data

Oct. 28, 2013 (JP) ................................ 2013-223188

(51) Int. Cl.
*H01L 21/67* (2006.01)
*H01L 21/66* (2006.01)
(Continued)

(52) U.S. Cl.
CPC .... *H01L 21/67715* (2013.01); *G05B 19/4185* (2013.01); *H01L 21/67276* (2013.01);
(Continued)

(58) Field of Classification Search
CPC ......... H01L 21/67715; H01L 21/67276; H01L 21/67733; G05B 19/4185;
(Continued)

(56) References Cited

U.S. PATENT DOCUMENTS 7,587,485 B1 * 9/2009 Chitnis ................. H04L 43/022
709/224
8,271,778 B1 * 9/2012 Zhou ...................... H04L 43/04
709/224

(Continued)

FOREIGN PATENT DOCUMENTS

| JP | 2011-018737 A | 1/2011 |
| WO | 2011/155040 A1 | 12/2011 |
| WO | 2014/069029 A1 | 5/2014 |

OTHER PUBLICATIONS

English translation of Official Communication issued in corresponding International Application PCT/JP2014/004759, dated May 12, 2016.

*Primary Examiner* — Ly D Pham
(74) *Attorney, Agent, or Firm* — Keating & Bennett, LLP

(57) ABSTRACT

A communication device includes a communicator that performs communication via a network, IO ports that connect with a manufacturing apparatus, a packet monitor that monitors, via the communicator, packet data communicated to and from the manufacturing apparatus via the network, an IO monitor that monitors states of the IO ports, and a controller configured or programmed to transmit monitoring information to a transportation apparatus via the communicator, the transportation apparatus transporting a processing target, and the monitoring information being obtained through the monitoring performed by the packet monitor and the IO monitor.

8 Claims, 7 Drawing Sheets

(51) Int. Cl.
*H01L 21/02* (2006.01)
*H01L 21/768* (2006.01)
*H01L 23/535* (2006.01)
*H01L 21/677* (2006.01)
*G05B 19/418* (2006.01)

(52) U.S. Cl.
CPC ............... *H01L 21/67733* (2013.01); *G05B 2219/33136* (2013.01); *G05B 2219/45031* (2013.01); *Y02P 90/18* (2015.11); *Y02P 90/185* (2015.11); *Y02P 90/20* (2015.11); *Y02P 90/28* (2015.11)

(58) Field of Classification Search
CPC ........... G05B 2219/33136; G05B 2219/45031; Y02P 90/18; Y02P 90/185; Y02P 90/20; Y02P 90/28
USPC ........................................................ 700/121
See application file for complete search history.

(56) References Cited

U.S. PATENT DOCUMENTS

| | | | | |
|---|---|---|---|---|
| 2002/0198988 | A1* | 12/2002 | Hirose | H04L 43/00 709/224 |
| 2006/0245424 | A1* | 11/2006 | Ramanathan | H04L 45/34 370/389 |
| 2008/0045804 | A1* | 2/2008 | Williams | A61B 5/112 600/300 |
| 2009/0144410 | A1* | 6/2009 | Fink | H04L 43/062 709/224 |
| 2010/0202861 | A1 | 8/2010 | Sawado et al. | |
| 2012/0300628 | A1* | 11/2012 | Prescott | H04L 43/026 370/232 |
| 2013/0117565 | A1* | 5/2013 | He | H04L 63/061 713/168 |
| 2013/0132268 | A1* | 5/2013 | Cooper | G06Q 40/025 705/38 |
| 2015/0289167 | A1* | 10/2015 | Alex | H04W 28/24 370/329 |

* cited by examiner

FIG. 7

| Apparatus address | IP 2 | | IP 3 | |
|---|---|---|---|---|
| Loading port | 1 | 2 | 1 | 2 |
| Global ID | 105 | 106 | 107 | 108 |
| Transportation vehicle | | | 521 | |

112

COMMUNICATION DEVICE AND METHOD FOR CONTROLLING COMMUNICATION DEVICE

BACKGROUND OF THE INVENTION

1. Field of the Invention

The present invention relates to a communication device to be connected with a manufacturing apparatus and a method for controlling a communication device.

2. Description of the Related Art

Transportation vehicles such as overhead traveling vehicles have conventionally been used for loading and transporting pods (e.g., front opening unified pods (FOUPs)) housing a wafer on and to a loading port of a semiconductor manufacturing apparatus, for example. The main body of the semiconductor manufacturing apparatus is controlled by a manufacturing controller. The overhead traveling vehicle is, on the other hand, controlled by a transportation controller. The E84 standard of Semiconductor Equipment and Materials International (SEMI) applies to communication between the loading port and the overhead traveling vehicle, (for example, see Japanese Unexamined Patent Application Publication No. 2010-184760 and Japanese Unexamined Patent Application Publication No. 2011-018737).

With such a system, the manufacturing controller instructs the semiconductor manufacturing apparatus to perform processing on a certain pod based on a manufacturing schedule. To correspond to the processing based on the manufacturing schedule, the transportation controller generates a transportation schedule and sends a transportation instruction to the overhead traveling vehicle.

With such a system as described above, when the semiconductor manufacturing apparatus makes a request for a change in the manufacturing schedule, the manufacturing controller changes the manufacturing schedule based on the change request. The manufacturing controller then transmits the change to the transportation controller. The transportation controller issues an instruction to the overhead traveling vehicle to carry in a pod based on the changed manufacturing schedule.

Thus, an instruction from the manufacturing controller located upstream on the manufacturing side is received by the transportation controller located upstream on the transportation side in order to control the overhead traveling vehicle.

As described above, when the semiconductor manufacturing apparatus or the like has a change to the manufacturing schedule, it takes time for the change to take effect because the change in the schedule is first transmitted to the manufacturing controller located upstream of the semiconductor manufacturing apparatus, and then the manufacturing controller transmits the change in the schedule to the transportation controller which then issues a transportation instruction to the overhead traveling vehicle. Consequently, if the overhead traveling vehicle has already started traveling, the transportation route of the overhead traveling vehicle may not be changed efficiently, which results in a problem of making the transportation and manufacturing less efficient.

SUMMARY OF THE INVENTION

Preferred embodiments of the present invention have been conceived in view of the above-described circumstance, and provide a communication device which enables a transportation apparatus including a transportation vehicle such as an overhead traveling vehicle to efficiently change the transportation route.

A communication device according to an aspect of various preferred embodiments of the present invention is a communication device to be connected with a manufacturing apparatus, the communication device including: a communicator that performs communication via a network; at least one IO port that connects with the manufacturing apparatus; a packet monitor that monitors, via the communicator, packet data communicated to and from the manufacturing apparatus via the network; an IO monitor that monitors a state of the at least one IO port; and a controller that is configured or programmed to transmit monitoring information to a transportation apparatus via the communicator, wherein the transportation apparatus transports a processing target to and/or from the manufacturing apparatus, the monitoring information is obtained through the monitoring performed by the packet monitor and the IO monitor.

With this, when an error occurs in the manufacturing apparatus, for example, it is possible for the transportation apparatus to know the state of the manufacturing apparatus before receiving, from a controller located upstream, a notification of a change in the manufacturing schedule, and to efficiently change the transportation route according to the state of the manufacturing apparatus.

The communicator may include: a first communication port to be connected with the manufacturing apparatus; a second communication port to be connected with an external apparatus; a third communication port to be connected with the transportation apparatus; and a relay that relays packet data between the first communication port and the second communication port, and the packet monitor monitors the packet data relayed by the relay between the manufacturing apparatus and the external apparatus.

With this, the communication device defines and functions as a relay device for the network connection such as a LAN connection between the manufacturing apparatus and the external apparatus which is, for example, a manufacturing controller. It is thus unnecessary to install, for example, a new LAN cable for the communication device.

The at least one IO port may be connected to a loading port which is to carry in and out the processing target of the manufacturing apparatus, and the IO monitor may monitor a state of the loading port.

This enables monitoring of the state of the loading port which is to carry in and out the processing target.

The controller may be configured or programmed to convert first identification information included in the monitoring information obtained through the monitoring performed by the packet monitor, to second identification information, and transmit monitoring information including the second identification information to the transportation apparatus, the first identification information being information allowing the manufacturing apparatus to identify the loading port, and the second identification information being information allowing the transportation apparatus to identify the loading port.

This enables accurate recognition of the monitoring information on the transportation apparatus side even when the identification information of the loading ports which is to be used by the manufacturing controller and the identification information of the loading ports which is to be used by the transportation apparatus are different from each other.

The controller may be further configured or programmed to determine whether or not the monitoring information obtained through the monitoring performed by the packet monitor includes a predetermined command, and transmit the monitoring information to the transportation apparatus when the monitoring information includes the predetermined command.

This makes it possible to take action according to the predetermined command such as a command indicating occurrence of an error and a command indicating a change in the state of the apparatus, e.g., a change to the manual mode.

The transportation apparatus may include: a transportation vehicle which transports the processing target to the manufacturing apparatus; and a transportation controller configured or programmed to control a plurality of the transportation vehicles, and the controller may be configured or programmed to transmit the monitoring information to at least one of the transportation vehicle and the transportation controller.

This makes it possible to transmit the monitoring information to at least one of the transportation vehicle and the transportation controller.

The transportation controller may be configured or programmed to assign, to one of the plurality of the transportation vehicles, transportation of the processing target to the manufacturing apparatus, and transmit third identification information to the manufacturing apparatus to identify the transportation vehicle to which the transportation of the processing target is assigned, and the controller may be configured or programmed to transmit the monitoring information to the transportation vehicle identified by the third identification information.

This makes it possible to transmit the monitoring information to the transportation vehicle as well if the third identification information, e.g., the vehicle number, of the transportation vehicle to which the transportation of the processing target is assigned has been notified, and it is thus possible to take action more promptly.

It is to be noted that these general or specific aspects of the preferred embodiments of the present invention may be implemented by a system, a method, an integrated circuit, a computer program, or a computer-readable recording medium such as a Compact Disc Read Only Memory (CD-ROM), or by any combination of a system, a method, an integrated circuit, a computer program, and a recording medium.

Preferred embodiments of the present invention enable a transportation apparatus including a transportation vehicle such as an overhead traveling vehicle to efficiently change a transportation route even when there is a change in the manufacturing schedule, for example.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a diagram illustrating another example of a conversion table included in a controller of a communication device according to a preferred embodiment of the present invention.

DETAILED DESCRIPTION OF THE PREFERRED EMBODIMENTS

Hereinafter, preferred embodiments will be specifically described with reference to the drawings.

It is to be noted that the following preferred embodiments are general or specific examples. The numerical values, shapes, materials, structural elements, the arrangement and connection of the structural elements, steps, and the processing order of the steps etc., shown in the following preferred embodiments are mere examples, and therefore do not limit the present invention. Furthermore, among the structural elements in the following preferred embodiments, structural elements not recited in any one of the independent claims representing the most generic concepts are described as arbitrary structural elements.

Figure 1:
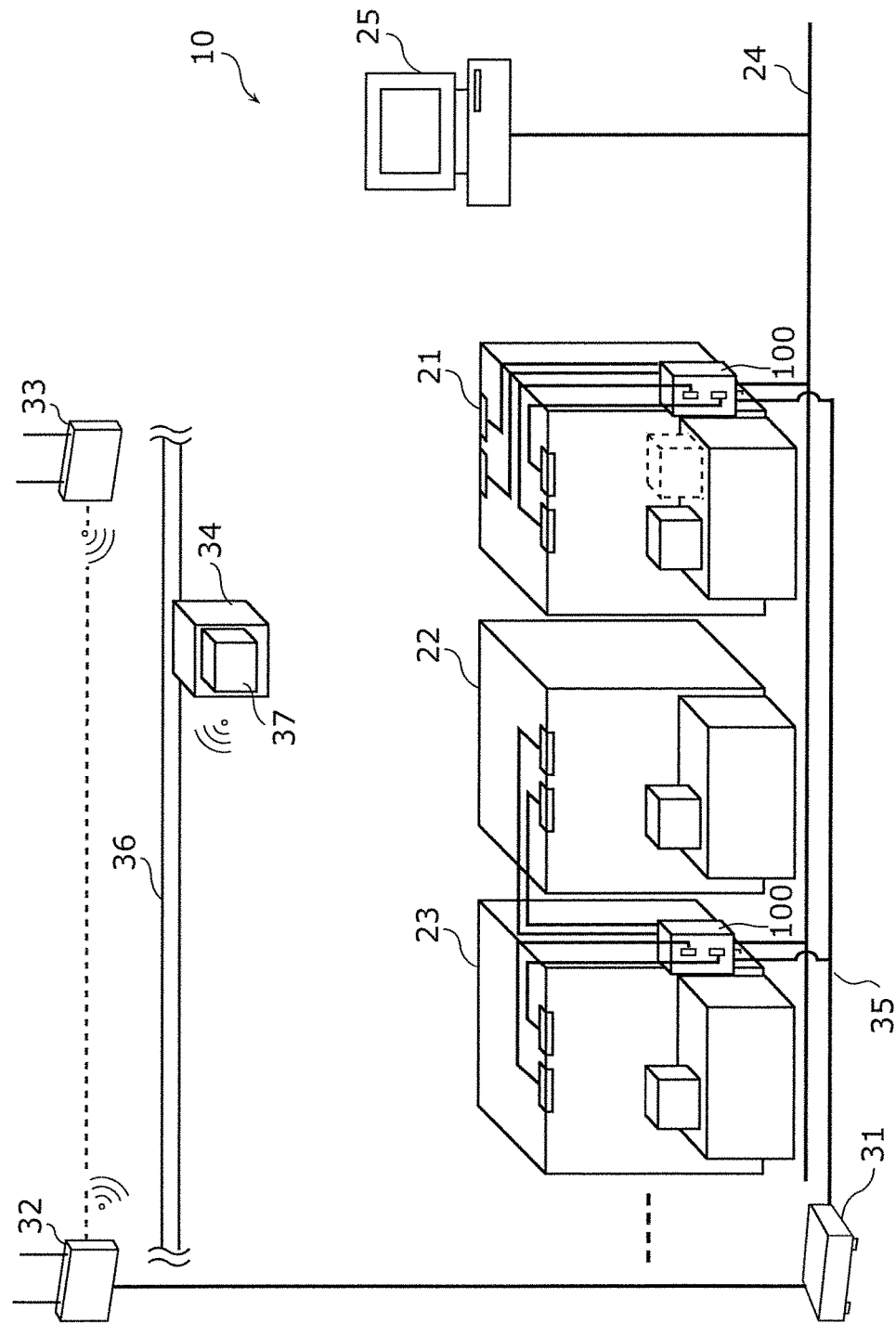
FIG. 1 is a schematic diagram illustrating an example of an outline of a manufacturing system including a communication device according to a preferred embodiment of the present invention.

FIG. 1 is a schematic diagram illustrating an example of an outline of a manufacturing system including a communication device according to a preferred embodiment of the present invention.

A manufacturing system 10 is, for example, a system for manufacturing products such as semiconductors, and includes, as a manufacturing-side system, manufacturing apparatuses 21, 22, 23 . . . , a local area network (LAN) 24, and a manufacturing controller 25 as illustrated in FIG. 1. The manufacturing system 10 also includes, as a transportation-side system, a transportation controller 31, wireless access points 32 and 33, a plurality of overhead traveling vehicles (transportation vehicles) 34, a LAN 35, and a rail 36. It is to be noted that although a manufacturing system which manufactures products such as semiconductors typically includes a plurality of manufacturing apparatuses, FIG. 1 illustrates three manufacturing apparatuses for the sake of convenience. Also, the manufacturing system typically includes a plurality of (for example, several tens to several hundreds of) overhead traveling vehicles (transportation vehicles) 34, FIG. 1 illustrates only one overhead traveling vehicle (transportation vehicle) for the sake of convenience. Moreover, the LAN 24 and the LAN 35 may be independent of each other or may be connected via a gateway or the like, for example.

The manufacturing apparatuses 21, 22, and 23 are, for example, manufacturing apparatuses which manufacture products such as semiconductors, and each include one or more loading ports for, for example, carrying in and out pods 37 each housing a processing target such as a wafer. In the example illustrated in FIG. 1, the manufacturing apparatus 21 includes four loading ports. The manufacturing apparatuses 22 and 23 each include two loading ports, for example.

The LAN 24 is a network that connects each of the manufacturing apparatuses 21, 22, and 23 with the manufacturing controller 25.

The manufacturing controller 25 generates a manufacturing schedule, and based on the manufacturing schedule generated, instructs each of the manufacturing apparatuses 21, 22, and 23 connected with the manufacturing controller 25 via the LAN 24 to perform processing on a certain pod 37 (in practice, the processing target housed in the pod). Furthermore, the manufacturing controller 25 requests the transportation controller 31 to transport the certain pod 37 on which the processing is to be performed.

The transportation controller 31 generates a transportation schedule according to the request from the manufacturing controller 25. Based on the transportation schedule generated, the transportation controller 31 instructs each of the overhead traveling vehicles 34 to transport a certain pod 37.

The wireless access points 32 and 33 are wireless LAN access points which are connected to the LAN 35 for communication with the overhead traveling vehicles (transportation vehicles) 34 via a wireless LAN.

Each overhead traveling vehicle 34 is attached to the rail 36 in the form of suspension from the rail 36, and travels along the rail 36 to transport the pod 37 to the manufacturing apparatuses 21, 22, 23, etc. Furthermore, each overhead traveling vehicle 34 includes a controller and a communicator (not illustrated), to communicate with the transportation controller 31 and each of the manufacturing apparatuses 21, 22, and 23 and to control the transportation of the pod 37 to and from the loading ports of the manufacturing apparatuses 21, 22, and 23.

The LAN 35 is a network that connects each overhead traveling vehicle 34, the transportation controller 31, and each of the manufacturing apparatuses 21, 22, and 23.

A communication device 100 is connected with the manufacturing-side system and the transportation-side system.

Figure 2:
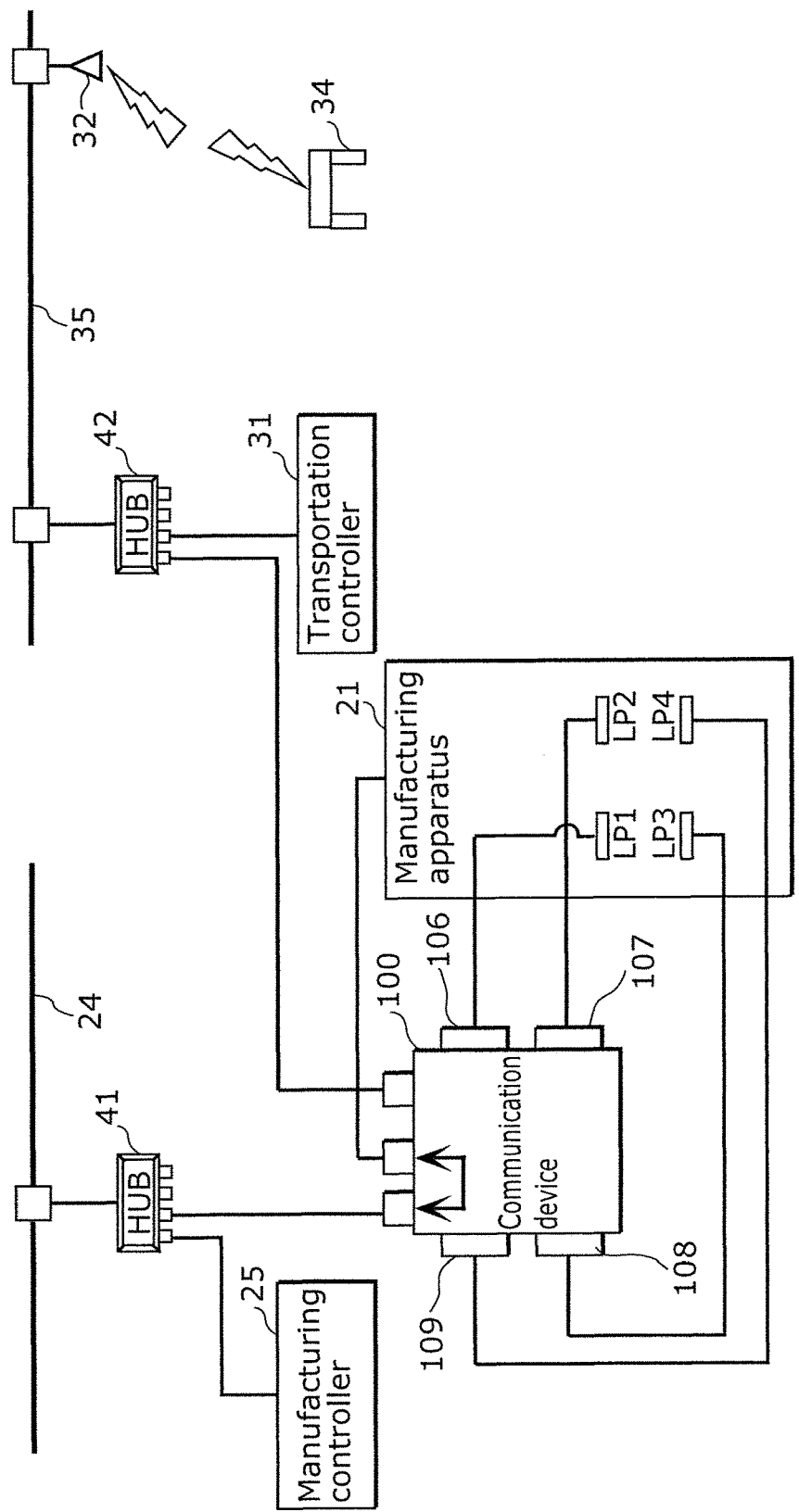
FIG. 2 is a diagram illustrating an example of connections within a manufacturing system including a communication device according to a preferred embodiment of the present invention.

FIG. 2 is a diagram illustrating an example of connections within the manufacturing system including the communication device 100 according to the present preferred embodiment. FIG. 2 illustrates an example where the communication device 100 is connected to the manufacturing apparatus 21 including four loading ports. As in FIG. 1, the LAN 24 and the LAN 35 are not illustrated as being connected to each other, but may be independent of each other or may be connected via a gateway or the like, for example.

The communication device 100 is connected to the LAN 24 via a hub 41. The communication device 100 is also connected to the LAN 35 via a hub 42. The communication device 100 is connected to the manufacturing apparatus 21 via a LAN. Furthermore, each of IO ports 106 to 109 of the communication device 100 is connected to a corresponding one of the loading ports (LP1, LP2, LP3, and LP4) of the manufacturing apparatus 21. It is to be noted that although FIG. 2 illustrates the communication device 100 and the manufacturing controller 25 which are connected to the same hub 41, the manufacturing controller 25 may be connected to the LAN 24 either directly or via another hub. Also, although the communication device 100 and the transportation controller 31 are connected to the same hub 42, the transportation controller 31 may be connected to the LAN 35 either directly or via another hub.

Figure 3:
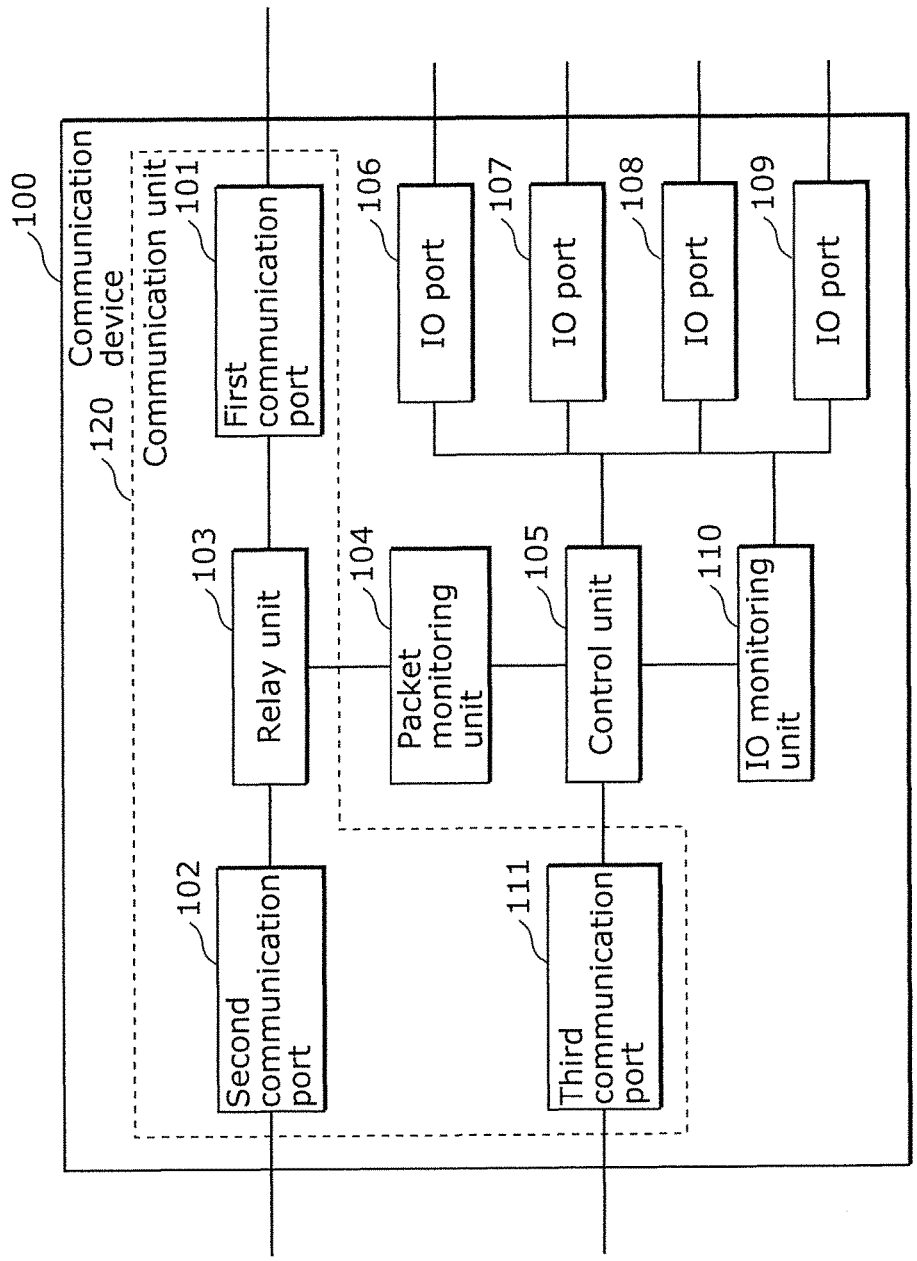
FIG. 3 is a block diagram illustrating a functional configuration of a communication device according to a preferred embodiment of the present invention.

FIG. 3 is a block diagram illustrating a functional configuration of the communication device 100 according to the present preferred embodiment.

The communication device 100 is a device to be connected with the manufacturing apparatuses 21, 22, and 23, and includes a first communication port 101, a second communication port 102, a relay 103, a packet monitor 104, a controller 105, the IO ports 106, 107, 108, and 109, an IO monitor 110, and a third communication port 111 as illustrated in FIG. 3. The first communication port 101, the second communication port 102, the third communication port 111, and the relay 103 constitute a communicator 120.

The first communication port 101, the second communication port 102, and the third communication port 111 are ports for communication via a LAN.

The relay 103 relays packet data between the first communication port 101 and the second communication port 102. More specifically, the relay 103 relays packet data between the manufacturing apparatus 21 connected to the first communication port 101 and the manufacturing controller 25 connected to the second communication port 102.

The packet monitor 104 monitors the packet data relayed by the relay 103 between the first communication port 101 and the second communication port 102. More specifically, the packet monitor 104 monitors the packet data communicated between the manufacturing apparatus 21 connected to the first communication port 101 and the manufacturing controller 25 connected to the second communication port 102.

The IO ports 106, 107, 108, and 109 are connected to the loading ports (LP1, LP2, LP3, and LP4) of the manufacturing apparatus 21 via wired parallel communication lines, for example, and are parallel ports that input and output 8-bit signal data in each direction, that is, 16-bit signal data in both directions. Here, the input and output signals are signals related to the carry-in and carry-out of the pods 37 according to the E84 communications protocol, for example.

The IO monitor 110 monitors the signals input to and output from each of the IO ports 106, 107, 108, and 109 to monitor the state of each of the IO ports 106, 107, 108, and 109. Here, the respective states of the IO ports 106, 107, 108, and 109 are data patterns of, for example, 8-bit data received from the IO ports 106, 107, 108, and 109.

The controller 105 transmits monitoring information obtained through the monitoring performed by the packet monitor 104 and the IO monitor 110, to the transportation controller 31 and the overhead traveling vehicle 34 via the third communication port 111. Furthermore, the controller 105 outputs data received from the overhead traveling vehicle 34 via the third communication port 111, to each of the IO ports 106, 107, 108, and 109. This enables each loading port (LP1, LP2, LP3, and LP4) of the manufacturing apparatus 21 and the overhead traveling vehicle 34 to exchange signals related to the carry-in and carry-out of the pod 37.

The controller 105 includes a conversion table 112, and converts first identification information to second identification information using the conversion table 112. Here, the first identification information is information which is included in the monitoring information obtained through the monitoring performed by the packet monitor 104 and allows the manufacturing apparatus 21 to identify the loading ports. The second identification information is information which allows the transportation controller 31 and the overhead traveling vehicle 34 to identify the loading ports. More specifically, the first identification information is information allowing the manufacturing apparatus 21 to identify the loading ports and is a local ID uniquely identified by the manufacturing apparatus 21 (for example, a port number from 1 to 4, etc.). The second identification information is information allowing the transportation controller 31 and the overhead traveling vehicle 34 to identify the loading ports, and is a global ID uniquely identified by the manufacturing system 10.

Figure 4A:
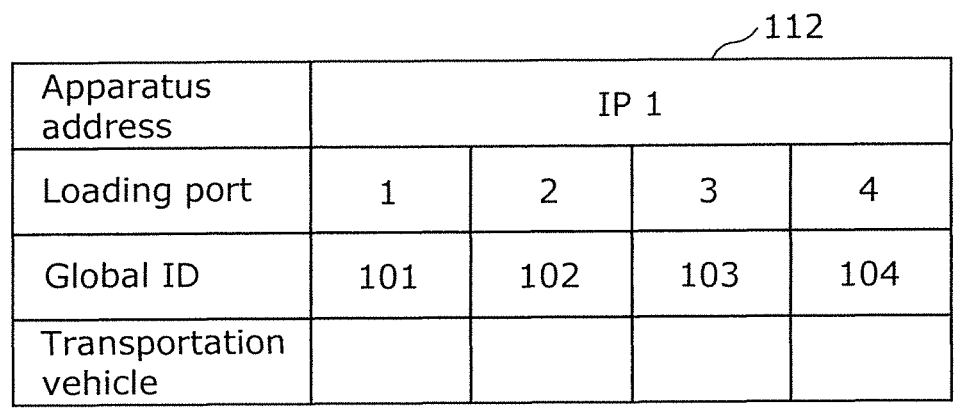
FIG. 4A is a diagram illustrating an example of a conversion table included in a controller of a communication device according to a preferred embodiment of the present invention.
Figure 4B:
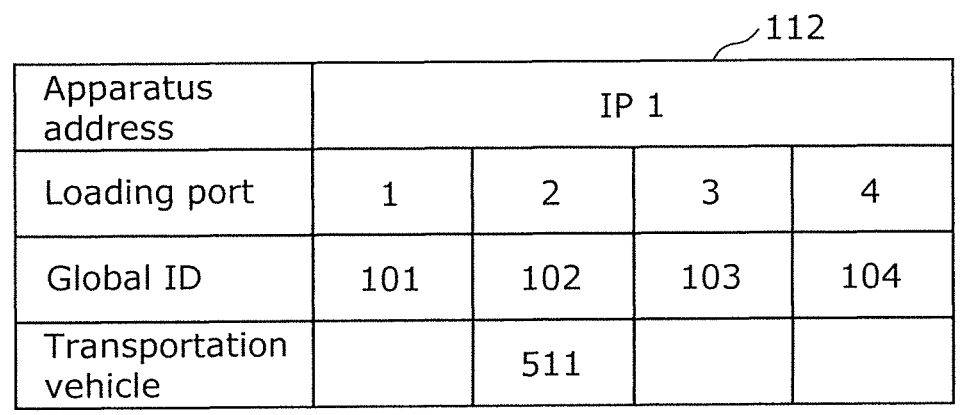
FIG. 4B is a diagram illustrating an example of a conversion table included in a controller of a communication device according to a preferred embodiment of the present invention.

FIG. 4A and FIG. 4B are diagrams each illustrating an example of the conversion table 112 included in the controller 105.

As illustrated in FIG. 4A and FIG. 4B, the conversion table 112 manages, in association with one another, the apparatus address, such as an Internet Protocol (IP) address, of the manufacturing apparatus 21 connected to the communication device 100, the port numbers of the loading ports, the global IDs of the loading ports, and the vehicle numbers of the overhead traveling vehicles 34 assigned to the loading ports.

The manufacturing controller 25 identifies the loading ports in the manufacturing system 10 using the apparatus address of the manufacturing apparatus 21 and the port numbers of the loading ports. The transportation controller 31 and the overhead traveling vehicles 34 identify the loading ports in the manufacturing system 10 using the global IDs as described above.

Next, operations of the manufacturing system 10 and the communication device 100 having the above-described configurations will be described.

In the manufacturing system 10, the manufacturing controller 25 generates a manufacturing schedule, and based on the manufacturing schedule generated, instructs each of the manufacturing apparatuses 21, 22, and 23 connected to the manufacturing controller 25 via the LAN 24 to perform processing on a certain pod 37. Furthermore, the manufacturing controller 25 requests the transportation controller 31 to transport the certain pod 37 on which the processing is to be performed.

The transportation controller 31 generates a transportation schedule according to the request from the manufacturing controller 25. Based on the transportation schedule generated, the transportation controller 31 instructs each overhead traveling vehicle 34 to transport a certain pod 37. More specifically, the transportation controller 31 assigns the transportation of the certain pod 37 on which processing is to be performed, to one of the plurality of overhead traveling vehicles 34, and instructs this overhead traveling vehicle 34 to transport the target pod 37. At this time, the transportation controller 31 transmits, to the manufacturing apparatus which is the transportation destination, third identification information to identify the overhead traveling vehicle 34 to which the transportation of the certain pod 37 has been assigned. Here, the third identification information is information which allows the manufacturing apparatus to identify the overhead traveling vehicle 34 and is a vehicle number uniquely identifying the overhead traveling vehicle 34 in the manufacturing system 10.

When the overhead traveling vehicle 34 transporting the target pod 37 arrives at the manufacturing apparatus (for example, the manufacturing apparatus 21) which is to perform processing on the target pod 37, the overhead traveling vehicle 34 and a target loading port (for example, LP1) of the manufacturing apparatus 21 exchange signals related to the carry-in and carry-out of the pod 37, to control the carry-in and carry-out (transfer) of the pod 37. More specifically, the controller 105 transmits, to the overhead traveling vehicle 34, the monitoring information obtained through the monitoring performed by the IO monitor 110, that is, information indicating the respective states of the loading ports (LP1, LP2, LP3, and LP4). Furthermore, the controller 105 outputs data received from the overhead traveling vehicle 34 to each of the IO ports 106, 107, 108, and 109. This enables each loading port (LP1, LP2, LP3, and LP4) of the manufacturing apparatus 21 and the overhead traveling vehicle 34 to exchange the signals related to the carry-in and carry-out of the pod 37.

When the pod 37 is loaded on the loading port (LP1) of the manufacturing apparatus 21, the manufacturing apparatus 21 performs processing on the processing target housed in the pod 37.

In such a manner as described above, the manufacturing system 10 performs a series of processing and manufactures a product such as a semiconductor.

The manufacturing apparatus 21 transmits a predetermined command to the manufacturing controller 25 on a per loading port basis (i.e., for each of LP1, LP2, LP3, and LP4) when an error has occurred or when the state of the apparatus has changed, e.g., when the mode of the apparatus has been changed to the manual mode, for example. This allows the manufacturing controller 25 to know the respective states of the loading ports of the manufacturing apparatus 21; for example, the manufacturing controller 25 becomes aware of which one of the loading ports of the manufacturing apparatus 21 has become unusable. When, for example, a loading port of the manufacturing apparatus 21 has become unusable, the manufacturing controller 25 changes the manufacturing schedule.

Hereinafter, an operation of the communication device 100 performed in such a case will be described.

Figure 5:
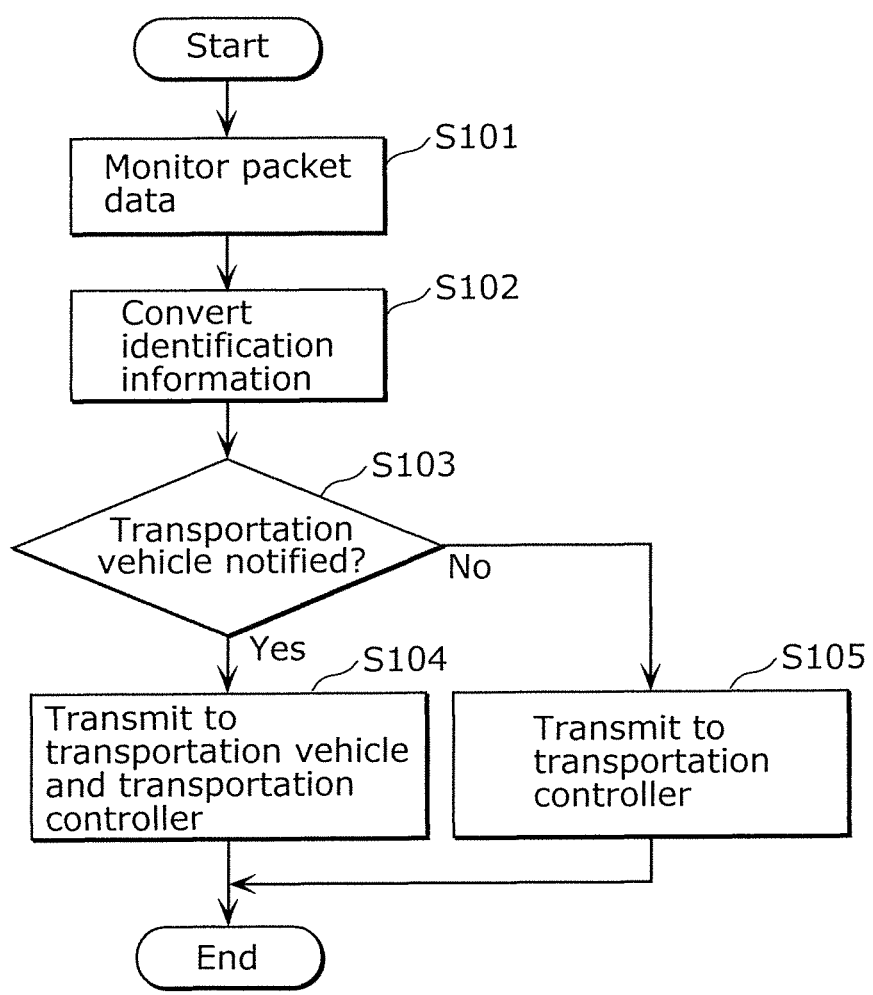
FIG. 5 is a flow chart illustrating a flow of an operation of a communication device according to a preferred embodiment of the present invention.

FIG. 5 is a flow chart illustrating a flow of an operation of the communication device 100 according to the present preferred embodiment.

The packet monitor 104 monitors the packet data communicated between the manufacturing apparatus 21 connected to the first communication port 101 and the manufacturing controller 25 connected to the second communication port 102 (Step S101). The packet monitor 104 then transmits the monitored packet data to the controller 105.

Using the conversion table 112, the controller 105 converts the port number of the loading port targeted by the command included in the packet data, into a global ID uniquely identified by the manufacturing system 10 (Step S102). For example, in the case of using the conversion table 112 as illustrated in FIG. 4A, the controller 105 converts, for example, a port number "2" into a global ID "102". Here, the command is transmitted from the manufacturing apparatus 21 to the manufacturing controller 25 and is, for example: a command indicating a change in the state of the apparatus, such as a change to the manual mode; a command indicating occurrence of an error; and a command indicating completion of the processing on the processing target at a loading port of the manufacturing apparatus.

Next, the controller 105 determines whether or not the controller 105 has been notified of the vehicle number of the overhead traveling vehicle 34 to which the transportation of the pod 37 to the loading port targeted by the command included in the packet data has been assigned (Step S103). Here, the vehicle number of the overhead traveling vehicle 34 is assigned and transmitted by the transportation controller 31 as described above. For example, when the controller 105 has been notified of the vehicle number "511" as the vehicle number of the overhead traveling vehicle 34 to which the transportation of the pod 37 to the loading port having the global ID "102" has been assigned, the controller 105 updates the conversion table 112 as illustrated in FIG. 4B. Using this conversion table 112, the controller 105 determines whether or not the controller 105 has been notified of the vehicle number of the overhead traveling vehicle 34.

If this determination shows that the controller 105 has been notified of the vehicle number of the overhead traveling vehicle 34 (Yes in Step S103), the controller 105 transmits the monitoring information obtained through the monitoring performed by the packet monitor 104 to the overhead traveling vehicle 34 identified by the notified vehicle number and to the transportation controller 31 (Step S104). More specifically, the controller 105 transmits the command included in the packet data and the global ID of the loading port targeted by the command. After receiving the monitoring information, the overhead traveling vehicle 34 changes its transfer to the target loading port according to the details of the command. For example, the overhead traveling vehicle 34 cancels transfer of the pod to or from the target loading port when the command is a command indicating that the loading port has become unusable, for example: a command indicating a change in the state of the apparatus such as a change to the manual mode; and a command indicating occurrence of an error. According to the details of the command and the loading port targeted by the command, the transportation controller 31 re-generates or changes the transportation schedule. If, for example, there is another loading port which is located on the traveling route of the overhead traveling vehicle 34 and available for the pod transfer, the transportation controller 31 makes the overhead traveling vehicle 34 transfer the pod to or from this loading port.

On the other hand, if the controller 105 has not been notified of the vehicle number of the overhead traveling vehicle 34 (No in Step S103), the controller 105 transmits the monitoring information obtained through the monitoring performed by the packet monitor 104 to the transportation controller 31 (Step S105). After receiving the monitoring information, the transportation controller 31 re-generates the transportation schedule according to the monitoring information, that is, according to the details of the command and the loading port targeted by the command.

Next, another example of connections between the communication device 100 and the manufacturing apparatuses will be described.

Figure 6:
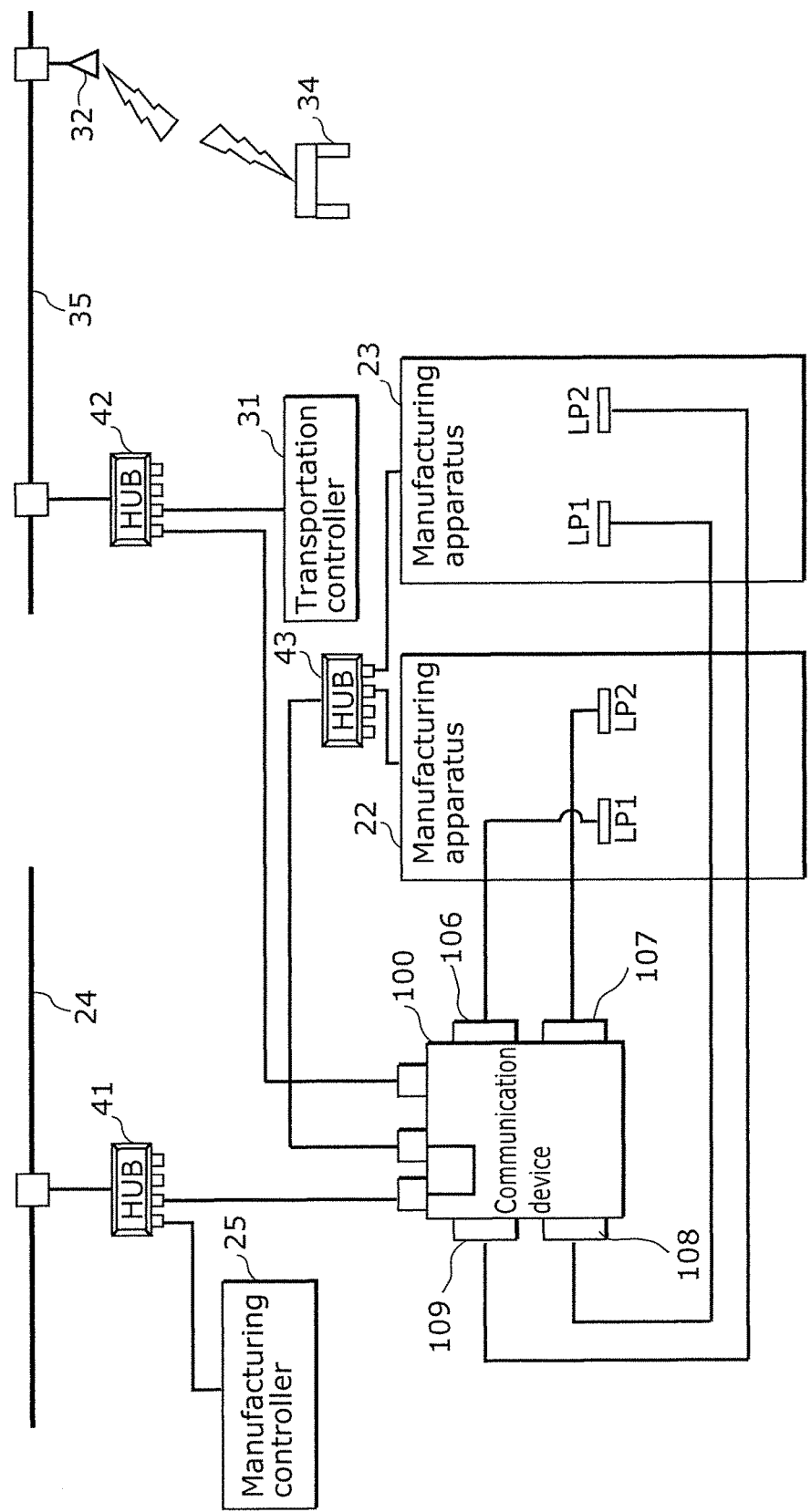
FIG. 6 is a diagram illustrating another example of connections within a manufacturing system including a communication device according to a preferred embodiment of the present invention.

FIG. 6 is a diagram illustrating another example of connections within the manufacturing system including the communication device 100 according to the present preferred embodiment. FIG. 6 illustrates an example where the communication device 100 is connected to the manufacturing apparatuses 22 and 23 each including two loading ports. FIG. 7 is a diagram illustrating an example of the conversion table 112 included in the controller 105.

The communication device 100 is connected to the LAN 24 via the hub 41. The communication device 100 is also connected to the LAN 35 via the hub 42. The communication device 100 is connected to the manufacturing apparatuses 22 and 23 via a LAN and a hub 43. Furthermore, each of the IO ports 106 to 109 of the communication device 100 is connected to a corresponding one of the loading ports (LP1, LP2) of the manufacturing apparatuses 22 and 23.

When the connections are made in such a manner, the conversion table 112 included in the controller 105 manages, in association with one another, the apparatus addresses of the manufacturing apparatuses 22 and 23 connected to the communication device 100, the port numbers of the loading ports, the global IDs of the loading ports, and the vehicle numbers of the overhead traveling vehicles 34 assigned to the loading ports, as illustrated in FIG. 7. In the example illustrated in FIG. 7, the apparatus address of the manufacturing apparatus 22 is "IP2", and the apparatus address of the manufacturing apparatus 23 is "IP3".

As described above, in the present preferred embodiment, the packet data communicated between the manufacturing apparatus 21 (22, 23 . . . ) and the manufacturing controller 25 is monitored, and the monitoring information obtained through the monitoring is transmitted to at least one of the overhead traveling vehicle 34 and the transportation controller 31. This makes it possible to know the state of the manufacturing apparatus before receiving from the manufacturing controller 25 a notification of a change in the manufacturing schedule, and to change the transportation schedule according to the state of the manufacturing apparatus. The transportation route is thus able to be efficiently changed. Moreover, if the vehicle number of the overhead traveling vehicle 34 to which the pod transportation is assigned has been notified, it means that the monitoring information has been transmitted to the overhead traveling vehicle 34 as well, and thus it is possible to more promptly deal with the change in the manufacturing schedule.

According to the present preferred embodiment, the controller 105 monitors the packet data communicated between the manufacturing apparatus 21 and the manufacturing controller 25, and transmits all the monitoring information to the transportation controller 31 or to each of the overhead traveling vehicle 34 and the transportation controller 31. However, the present invention is not limited to this. For example, the controller 105 may determine whether or not a predetermined command is included in the packet data communicated between the manufacturing apparatus 21 and the manufacturing controller 25, and transmit the monitoring information to at least one of the overhead traveling vehicle 34 and the transportation controller 31 only when the predetermined command is included.

Here, the predetermined command can be a command transmitted from the manufacturing apparatus 21 to the manufacturing controller 25 and indicating that one or more of the loading ports have become unusable. For example, the predetermined command can be a command indicating a change in the state of the apparatus such as a change to the manual mode or a command indicating occurrence of an error. In this case, the controller 105 transmits the monitoring information to at least one of the overhead traveling vehicle 34 and the transportation controller 31, so that the overhead traveling vehicle 34 can cancel the transfer of the pod to the target loading port. The predetermined command can also be a command indicating, for example, completion of processing on a processing target at a loading port of the manufacturing apparatus. In this case, the controller 105 transmits the monitoring information to the transportation controller 31, so that the overhead traveling vehicle 34 can be located, in advance, in the vicinity of the loading port at which the processing on the processing target has been completed, for example.

Although the overhead traveling vehicle is preferably used in the present preferred embodiment as the transportation vehicle, the present invention is not limited to this, and a traveling vehicle which travels on the ground, for example, may also be used.

Furthermore, the controller 105 according to the present preferred embodiment preferably converts the port numbers of the manufacturing apparatus into the global IDs using the conversion table 112, the present invention is not limited to this. For example, it is unnecessary to convert the identification information if the identification information of the loading ports which is to be used by the manufacturing controller 25 and the identification information of the loading ports which is to be used by the transportation controller 31 are identical.

The communication device according to one or more aspects has been described above based on preferred embodiments, but the present invention is not limited to the preferred embodiments. Various modifications to the preferred embodiments which may be conceived by those skilled in the art, as well as preferred embodiments resulting from combinations of structural elements of different preferred embodiments may be included within the scope of the one or more aspects, as long as such modifications and preferred embodiments do not depart from the essence of the present invention.

Preferred embodiments of the present invention enable a transportation apparatus including a transportation vehicle such as an overhead traveling vehicle, to efficiently change a transportation route, and is applicable to a manufacturing system for manufacturing products such as semiconductors.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A communication device to be connected with a manufacturing apparatus, the communication device comprising:
   a communicator that performs communication via a network;
   at least one IO port that connects with the manufacturing apparatus;
   a packet monitor that monitors, via the communicator, packet data communicated to and from the manufacturing apparatus via the network;
   an IO monitor that monitors a state of the at least one IO port; and
   a controller configured or programmed to transmit monitoring information to a transportation apparatus via the communicator; wherein
   the transportation apparatus is an apparatus that transports a processing target to and/or from the manufacturing apparatus; and
   the monitoring information is obtained through the monitoring performed by the packet monitor and the IO monitor.

2. The communication device according to claim 1, wherein the communicator includes:
   a first communication port to be connected with the manufacturing apparatus;
   a second communication port to be connected with an external apparatus;
   a third communication port to be connected with the transportation apparatus; and
   a relay that relays packet data between the first communication port and the second communication port; and
   the packet monitor monitors the packet data relayed by the relay between the manufacturing apparatus and the external apparatus.

3. The communication device according to claim 1, wherein
   the at least one IO port is connected to a loading port which carries in and out the processing target of the manufacturing apparatus; and
   the IO monitor monitors a state of the loading port.

4. The communication device according to claim 3, wherein the controller is further configured or programmed to convert first identification information included in the monitoring information obtained through the monitoring performed by the packet monitor, to second identification information, and transmit monitoring information including the second identification information to the transportation apparatus, the first identification information being information allowing the manufacturing apparatus to identify the loading port, and the second identification information being information allowing the transportation apparatus to identify the loading port.

5. The communication device according to claim 1, wherein the controller is further configured or programmed to determine whether or not the monitoring information obtained through the monitoring performed by the packet monitor includes a predetermined command, and transmit the monitoring information to the transportation apparatus when the monitoring information includes the predetermined command.

6. The communication device according to claim 1, wherein the transportation apparatus includes:
   a transportation vehicle that transports the processing target to the manufacturing apparatus; and
   a transportation controller that is configured or programmed to control a plurality of the transportation vehicles; wherein
   the controller is configured or programmed to transmit the monitoring information to at least one of the transportation vehicle and the transportation controller.

7. The communication device according to claim 6, wherein
   the transportation controller is configured or programmed to assign, to one of the plurality of the transportation vehicles, transportation of the processing target to the manufacturing apparatus, and transmit third identification information to the manufacturing apparatus for identifying the transportation vehicle to which the transportation of the processing target is assigned; and
   the controller is configured or programmed to transmit the monitoring information to the transportation vehicle identified by the third identification information.

8. A method for controlling a communication device including a communicator that performs communication via a network, and at least one IO port that connects with a manufacturing apparatus, the method comprising:
   monitoring, via the communicator, packet data communicated to and from the manufacturing apparatus via the network;
   monitoring a state of the at least one IO port; and
   transmitting monitoring information to a transportation apparatus via the communicator, the transportation apparatus being an apparatus that transports a processing target to and/or from the manufacturing apparatus, the monitoring information being obtained through the monitoring of packet data and the monitoring of a state of the at least one IO port.

* * * * *